United States Patent
Peng et al.

(10) Patent No.: US 10,643,951 B2
(45) Date of Patent: May 5, 2020

(54) MINI IDENTIFICATION MARK IN DIE-LESS REGION OF SEMICONDUCTOR WAFER

(71) Applicant: Taiwan Semiconductor Manufacturing Co., Ltd., Hsin-Chu (TW)

(72) Inventors: Yue-Lin Peng, Taoyuan (TW); Cheng-Yi Huang, Hsinchu (TW); Fu-Jen Li, Hsinchu (TW); Shou-Wen Kuo, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/904,657

(22) Filed: Feb. 26, 2018

(65) Prior Publication Data
US 2019/0019760 A1 Jan. 17, 2019

Related U.S. Application Data

(60) Provisional application No. 62/532,531, filed on Jul. 14, 2017.

(51) Int. Cl.
*H01L 21/68* (2006.01)
*H01L 23/544* (2006.01)
(Continued)

(52) U.S. Cl.
CPC .......... *H01L 23/544* (2013.01); *H01L 21/677* (2013.01); *H01L 21/67294* (2013.01); *H01L 21/68* (2013.01); *H01L 2223/54406* (2013.01); *H01L 2223/54433* (2013.01); *H01L 2223/54493* (2013.01)

(58) Field of Classification Search
None
See application file for complete search history.

(56) References Cited

U.S. PATENT DOCUMENTS

| 5,610,104 | A | 3/1997 | Mitchell |
| 5,956,596 | A * | 9/1999 | Jang .................. H01L 21/02043 |
| | | | 257/E21.224 |

(Continued)

FOREIGN PATENT DOCUMENTS

| JP | 2009277964 A | 11/2009 |
| TW | 447109 B | 7/2001 |

*Primary Examiner* — Bilkis Jahan
(74) *Attorney, Agent, or Firm* — Eschweiler & Potashnik, LLC

(57) ABSTRACT

A wafer includes a first face having a first center, and a second face having a second center. The first and second centers are each arranged on a central axis, which passes through the first face and the second face. The first face and the second face adjoin one another at a circumferential edge. An alignment notch is disposed along the circumferential edge, and extends inwardly from the circumferential edge by an alignment notch radial distance. The alignment notch radial distance is less than a wafer radius as measured from the first center to the circumferential edge. A die region includes an array of die arranged in rows and columns and is circumferentially bounded by a die-less region which is devoid of die. A first identification mark including a string of characters is disposed entirely in the die-less region to a first side of the alignment notch.

20 Claims, 11 Drawing Sheets

(51) Int. Cl.
*H01L 21/677* (2006.01)
*H01L 21/67* (2006.01)

(56) References Cited

U.S. PATENT DOCUMENTS

| | | | | |
|---|---|---|---|---|
| 6,303,899 | B1* | 10/2001 | Johnson | H01L 23/544 |
| | | | | 219/121.68 |
| 6,666,337 | B1 | 12/2003 | Conboy et al. | |
| 7,015,566 | B2* | 3/2006 | Iwase | H01L 23/544 |
| | | | | 257/48 |
| 2001/0038153 | A1* | 11/2001 | Sakaguchi | H01L 23/544 |
| | | | | 257/797 |
| 2005/0009298 | A1 | 1/2005 | Suzuki et al. | |
| 2005/0070074 | A1* | 3/2005 | Priewasser | B24B 7/228 |
| | | | | 438/462 |
| 2009/0102070 | A1* | 4/2009 | Feger | H01L 21/563 |
| | | | | 257/797 |
| 2010/0330798 | A1* | 12/2010 | Huang | H01L 21/6836 |
| | | | | 438/613 |
| 2013/0221439 | A1* | 8/2013 | Shimizu | G03F 9/708 |
| | | | | 257/347 |
| 2014/0264885 | A1* | 9/2014 | Tsai | H01L 23/544 |
| | | | | 257/769 |
| 2015/0024575 | A1 | 1/2015 | Hu et al. | |
| 2015/0147870 | A1* | 5/2015 | Sekiya | H01L 21/31116 |
| | | | | 438/464 |
| 2015/0219448 | A1* | 8/2015 | Tseng | H01L 22/10 |
| | | | | 356/401 |
| 2016/0027739 | A1 | 1/2016 | Park et al. | |

* cited by examiner

Enlarged view of circled portion of Fig. 6B

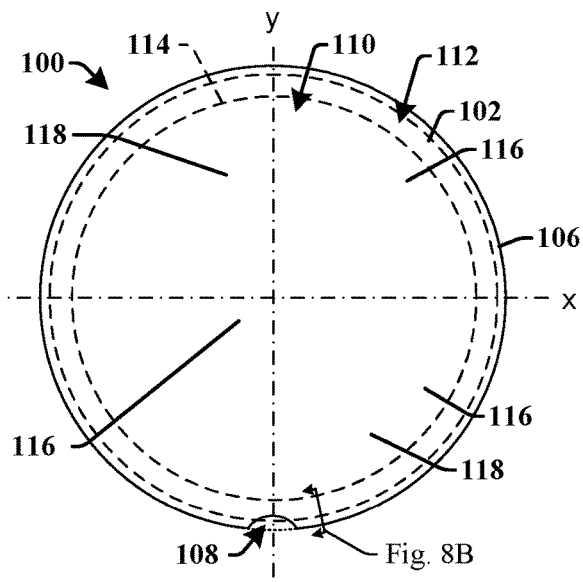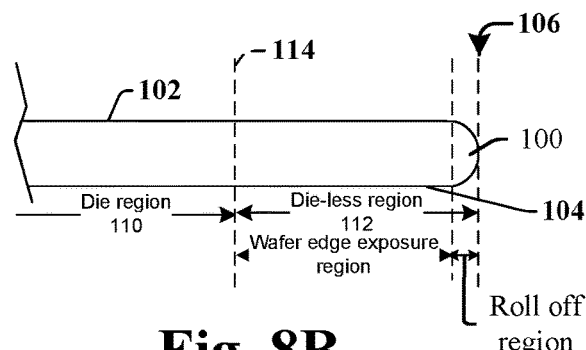
Fig. 8A
Fig. 8B
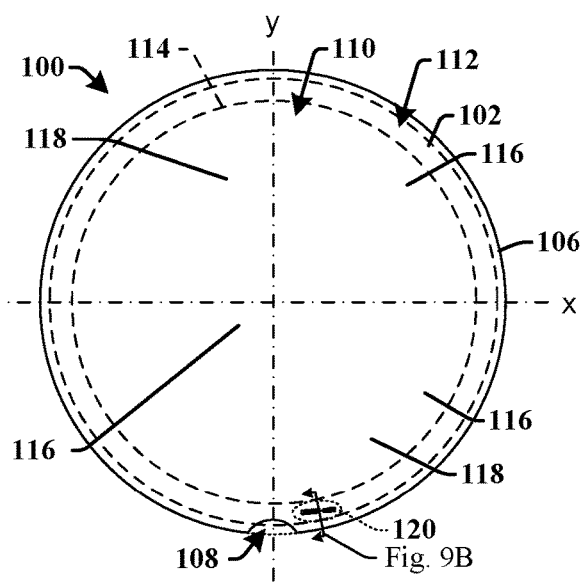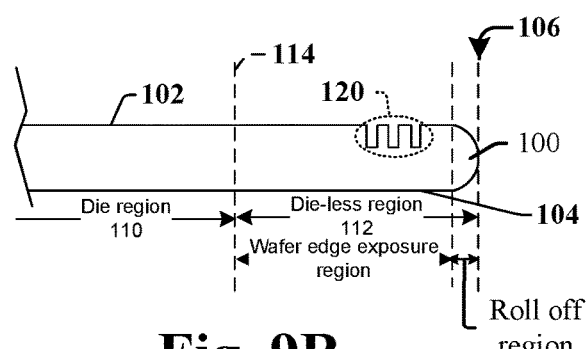
Fig. 9A
Fig. 9B

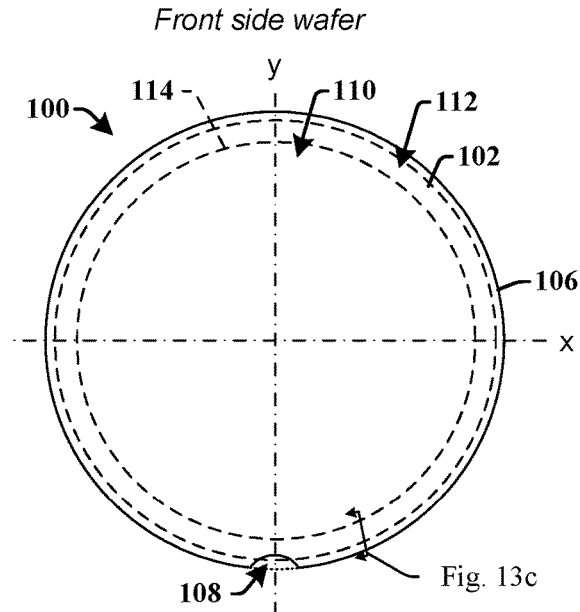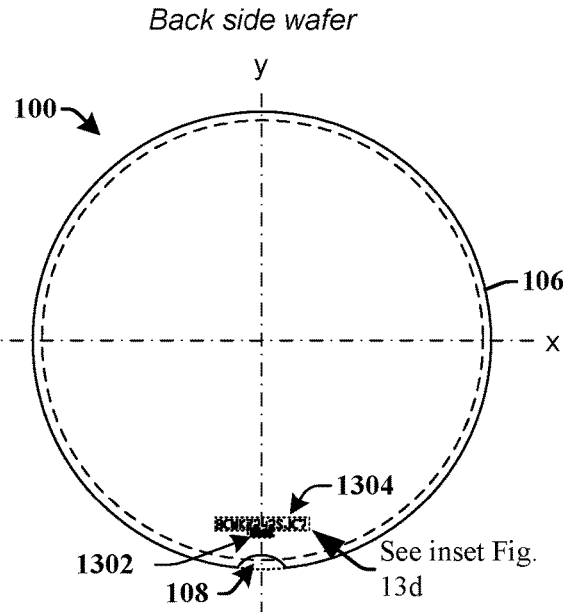
Fig. 13A  Fig. 13B
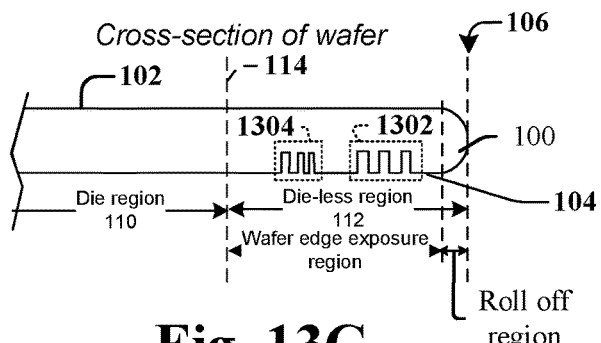
Fig. 13C
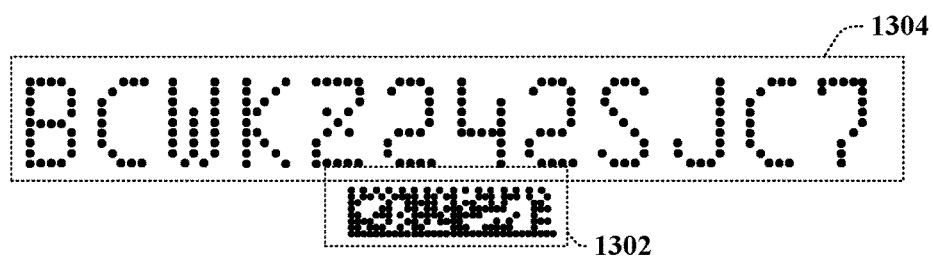
Fig. 13D

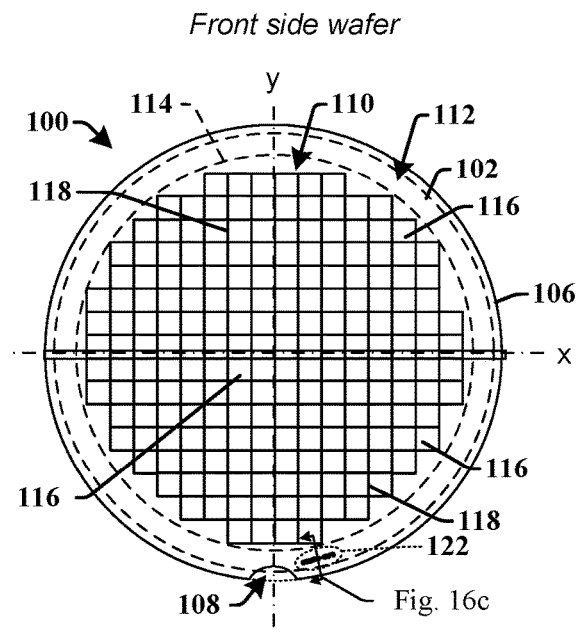
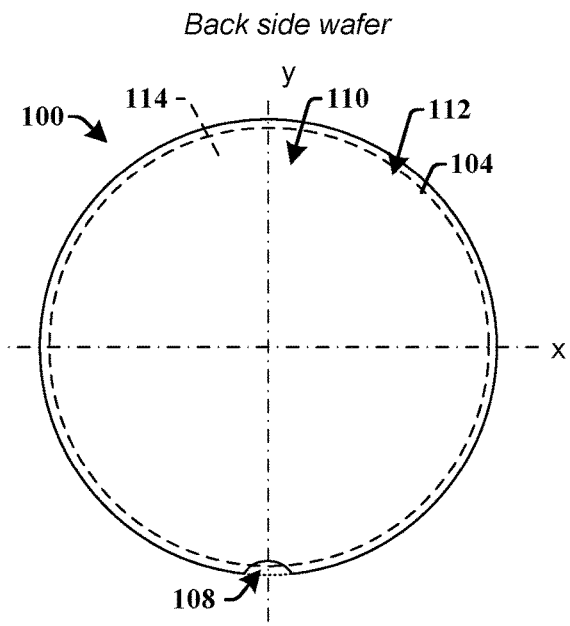
Fig. 16A  Fig. 16B
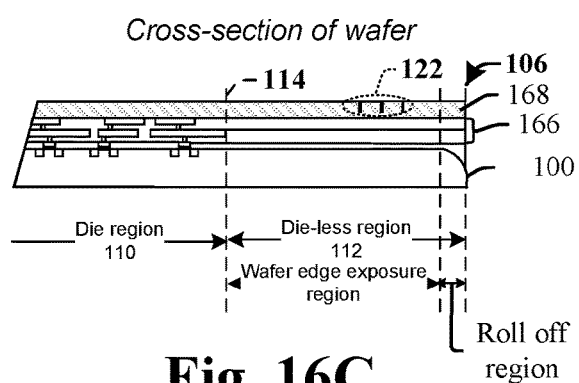
Fig. 16C of low quality, the wafer identification mark is unreadable

MINI IDENTIFICATION MARK IN DIE-LESS REGION OF SEMICONDUCTOR WAFER

REFERENCE TO RELATED APPLICATION

This application claims the benefit of U.S. Provisional Application No. 62/532,531, filed on Jul. 14, 2017, the contents of which are incorporated by reference in their entirety.

BACKGROUND

Semiconductor fabrication facilities (fabs) are factories where integrated chips are manufactured. The fabrication of integrated chips is performed by operating upon a semiconductor wafer with a plurality of processing steps (e.g., etching steps, patterning steps, deposition steps, implantation steps, etc.) to form millions or billions of semiconductor devices on and within the semiconductor wafer. The semiconductor wafers are subsequently diced to form multiple integrated chips from a single wafer. Semiconductor fabs often have throughputs of tens of thousands of wafer a month. Due to processing variations, the quality of different wafers may vary. Therefore, in order to track wafers and their associated chips through the manufacturing process, identification marks that uniquely identify the wafers are formed on each wafer. The identification marks facilitate traceability of wafers throughout the manufacturing and testing process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A-8B through FIGS. 11A-11B show a sample manufacturing flow, such as a 200 mm wafer manufacturing flow, where one or more identification mark(s) is/are formed solely on the front side of the wafer.

FIGS. 13A-13D through FIGS. 16A-16C show a sample manufacturing flow, such as a 300 mm wafer manufacturing flow, where a primary identification mark is formed solely on the back side of the wafer, and a supplemental identification mark is formed on the front side of a passivation layer after device features have been formed.

DETAILED DESCRIPTION

Figure 1:
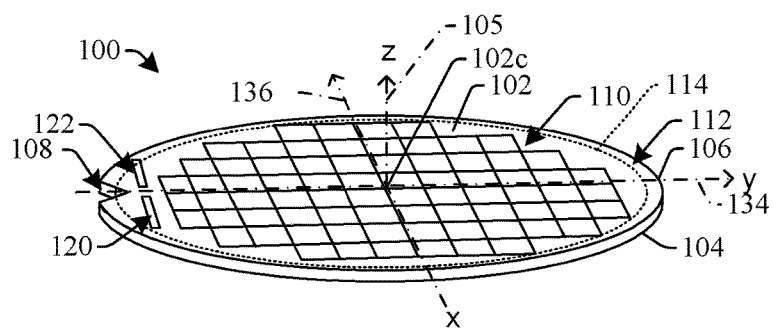
FIG. 1 illustrates a perspective view of a semiconductor wafer including an identification mark in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Identification marks are often formed in a semiconductor wafer prior to the formation of semiconductor devices, and serve as a means of identifying the wafer as it moves through the fab. During a typical process of forming an identification mark, a surface of the semiconductor wafer is etched, burned, imprinted, or otherwise patterned with the identification mark. In some embodiments, the identification mark can be placed directly on an upper surface of the semiconductor wafer, while in other embodiments the identification mark can be placed on an upper surface of a dielectric layer (e.g., silicon dioxide layer) directly over the upper surface of the semiconductor wafer. Openings or recesses in the upper surface of the semiconductor wafer and/or dielectric layer thereby correspond to the identification mark. These openings or recesses can be formed, for example, by a laser beam that is focused and pulsed in a pattern that punctures the surface of the semiconductor wafer and/or dielectric layer to form multiple discrete pits in the shape of the identification mark. For example, previous identification marks are 14 millimeter (mm) wide and 1.6 mm tall, and thus cover 22.4 sq. mm of area on the face of the wafer, and are spaced directly over a wafer notch so the identification notch is centered over the alignment notch. Further, in some cases where the wafer identification mark is degraded and/or unreadable (e.g., due to peeling of photoresist and/or other feature near the edge of the wafer), a second wafer identification mark, which is also 14 mm wide and 1.6 mm tall, may be formed directly over the first wafer identification mark.

These conventional identification marks are unduly large in many regards, and thus, the present disclosure relates to miniature identification marks whose size and arrangement are well suited to increase the number of die per wafer while at the same time providing fabs and outsourced assembly and test (OSAT) facilities with identification marks that are in easily accessible/readable locations on the wafer. Further, in some cases, the miniature identification marks are arranged sufficiently close to the edge of the wafer that peeling is not an issue, which is an advantage is some embodiments.

FIG. 1 illustrates a semiconductor wafer 100 in accordance with some embodiments. The semiconductor wafer 100 includes a first face 102 having a first center 102c, and a second face 104 having a second center (not viewable). A central axis 105 of the semiconductor wafer 100 passes through the first face 102 at the first center 102c and passes through the second face 104 at the second center. The first face 102 and the second face 104 adjoin one another at a circumferential edge 106, which is circular but for the presence of an alignment notch 108. The alignment notch 108 is disposed at a location along the circumferential edge 106 of the wafer. The alignment notch 108 extends inwardly from the circumferential edge 106 by an alignment notch radial distance. In some embodiments, the alignment notch radial distance is less than 10% of a wafer radius as measured from the first center 102c to the circumferential edge 106. In some embodiments, the alignment notch 108 has a rounded edge with an innermost curved region of the rounded edge corresponding to the innermost point (e.g., rounded shape), while in other embodiments the alignment notch has two linear or planar surfaces that meet at an innermost point of the alignment notch (e.g., triangular or pie shaped). In some embodiments, a die region edge 114 is spaced apart from an innermost tip of the alignment notch 108 such that the die region edge 114 is radially spaced apart from the circumferential edge 106 by an amount ranging from slightly less than the alignment notch radial distance to more than five times the alignment notch radial distance.

Figure 2:
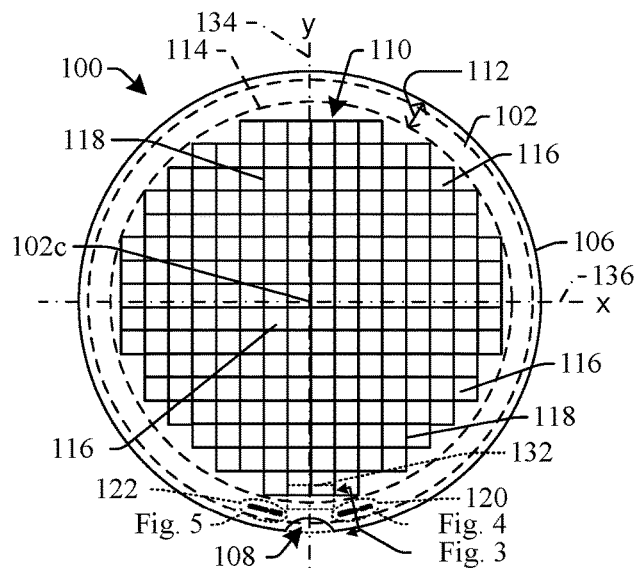
FIG. 2 illustrates a top view of a semiconductor wafer including an identification mark in accordance with some embodiments.

Referring now to FIG. 1 and FIG. 2 concurrently, with FIG. 2 illustrating a top view of the semiconductor wafer 100 consistent with FIG. 1, one can see the semiconductor wafer 100 includes central die region 110, which is circumferentially bounded by a die-less region 112 which is devoid of die. As illustrated in FIG. 2, the die region 110 includes an array of individual die 116 arranged in rows and columns. The individual die 116 are separated from one another by scribe lines 118, along which the wafer 100 will subsequently be singulated (e.g., cut or diced) into individual die. For simplicity and clarity in FIG. 2, only three individual die 116 and three scribe lines 118 have been labeled, but it will be appreciated that additional die and scribe lines are also present. Each individual die 116 includes functional circuitry, typically including semiconductor devices, such as diodes, resistors, capacitors, memory cells, and/or transistors (e.g., metal oxide semiconductor field effect transistors (MOSFETs), bipolar junction transistors (BJTs), fin field effect transistors (FINFETs), etc.) The scribe lines 118 may be devoid of functional circuitry and/or may include test structures or test circuits, which are typically removed via singulation prior to the final integrated circuits being diced and sold.

A generally circular die region edge 114 separates the die region 110 from the die-less region 112.

Figure 3:
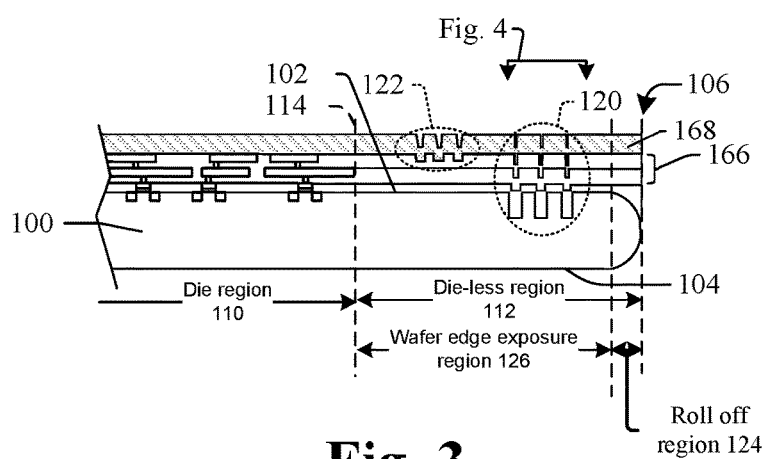
FIG. 3 illustrates a cross-sectional view of a semiconductor wafer including an identification mark in accordance with some embodiments.

As can be seen from FIG. 2 and FIG. 3, which depicts a cross-sectional view of the wafer 100, the die-less region 112 includes a roll-off region 124 where the first and second faces 102, 104 are beveled to adjoin the circumferential edge 106.

A wafer edge exposure region 126 separates the roll-off region 124 from the die region 110. The wafer edge exposure region 126 arises due to the fact that when photoresist is applied (e.g., spun on) to the first face 102 of the wafer during manufacturing, an outermost peripheral edge of the photoresist tends to be thicker than a central region of the photoresist, which can give rise to focusing issues and/or other issues during photolithography. Therefore, the wafer edge exposure region 126, which is expected to encompass any regions of "thicker" photoresist, is processed, for example by separate radiation treatments that are not applied to the central region of the photoresist, to remove and/or alter a thickness of the thicker photoresist and thereby improve yield for the wafer. In some embodiments, the circular die region edge 114 is radially spaced approximately 3 mm from the circumferential edge 106 to provide adequate spacing for the wafer edge exposure region 126 and the roll-off region 124.

A first identification mark 120 is disposed entirely in the die-less region 112 to a first side of the alignment notch 108. In contrast with conventional approaches, in which identification marks for wafers are placed on the y-axis 134 directly over the alignment notch 108 (see hashed region 132), the first identification mark 120 is offset relative to the alignment notch 108 and is smaller in size than a conventional identification mark, which increases the usable size of the die region 110 compared to conventional approaches. Thus, whereas conventional approaches may include an identification mark between an innermost tip of the alignment notch 108 and the center of the first face, in some embodiments the semiconductor wafer 100 exhibits an absence of an identification mark between an innermost tip of the alignment notch 108 and the bottom edge of a row of die in the die region 110 (e.g., semiconductor wafer 100 exhibits an absence of an identification mark between an innermost tip of the alignment notch 108 and the center of the first face). Alternatively, the identification mark can be reduced in size compared to conventional approaches, and can be positioned between an innermost tip of the alignment notch 108 and the bottom edge of a row of die so long as the reduced size identification mark does not overlap with the die region 110.

The first identification mark 120 can also avoid overlapping the roll-off region 124 (and/or straddling the boundary between the roll-off region 124 and wafer edge exposure region 126), as forming the first identification mark 120 in the roll-off region can cause laser defocus issues or other problems that can cause portions of the first identification mark 120 to be illegible.

For example, consider a case of a conventional 200 mm wafer, where a conventional identification mark is 22 mm wide and 1.84 mm tall and is arranged so its central axis lies along y-axis directly over the alignment notch (see hashed region 132). Due to this arrangement, the central die region can have a lowermost edge that is spaced 9 mm from the circumferential edge of the wafer under the alignment notch. In contrast, in cases of a 200 mm wafer where the first identification mark 120 is 4 mm wide by 0.6 mm tall and arranged to be offset from y-axis 134 and the alignment notch 108 and moved in the y-direction to be closer to the circumferential edge 106, the die region 110 can now be extended relative to conventional arrangements so the lowermost edge of the die region 110 is now just 3 mm from the circumferential edge of the wafer. This provides a small but significant increase in die area (and corresponding die yield) for the wafer 100, which increases the value of each wafer in a meaningful way.

As another example, consider a case of a conventional 300 mm wafer, where a conventional identification mark is 14 mm wide and 1.6 mm tall and arranged so its central axis lies along y-axis directly over the alignment notch. Due to this arrangement, the die region 110 can have a lowermost edge that is spaced 7.75 mm from the circumferential edge of the wafer. In contrast, in cases of a 300 mm wafer where the first identification mark 120 is 4 mm wide by 0.6 mm tall and arranged to be offset from y-axis 134 and the alignment notch 108 and moved in the y-direction to be closer to the circumferential edge 106, the die region 110 can now be extended relative to conventional arrangements so the lowermost edge of the die region 110 is now just 3 mm from the circumferential edge of the wafer. This provides a small but significant increase in die area (and corresponding die yield) for the wafer, which increases the value of each wafer in a meaningful way.

In some embodiments, a second identification mark 122, which is also disposed entirely in the die-less region 112, is disposed to a second side of the alignment notch 108. In some embodiments, such as shown in FIG. 2, the second identification mark 122 may be formed at a higher level (e.g., in a back-end-of-line (BEOL) metallization structure 166 or in a passivation layer 168 over the BEOL metallization structure) than the first identification mark 120. In some embodiments, the locations of the first and second identification marks 120, 122 are symmetric about the y-axis 134. However, in other embodiments, the locations of the first and second identification marks 120, 122 are symmetric about the x-axis 136, and/or are asymmetric about the y-axis 134 and/or asymmetric about the x-axis 136. More than two identification marks may also be disposed entirely in the die-less region 112.

In many instances, the semiconductor wafer 100 can have a diameter of 1-inch (25 mm; 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); or 450 mm (17.7 inch, usually referred to as "18 inch"); for example. In some embodiments, the semiconductor wafer 100 is a bulk substrate of monocrystalline silicon, but in other embodiments the semiconductor wafer can be made of group III and/or group V elements, such as GaAs, InGaAs, etc. In still other embodiments, the semiconductor wafer 100 is a semiconductor-on-insulator (SOI) substrate which includes a handle substrate and an epitaxially grown device layer stacked vertically on opposing sides of an insulating layer. The handle substrate and device layers include, for example, monocrystalline silicon and/or group III and/or group V elements; while the insulating layer includes a dielectric, such as silicon nitride, silicon dioxide, or silicon oxynitride; while the epitaxially grown device layer includes semiconductor material, such as monocrystalline silicon and/or group III and/or group V elements.

Figure 4:
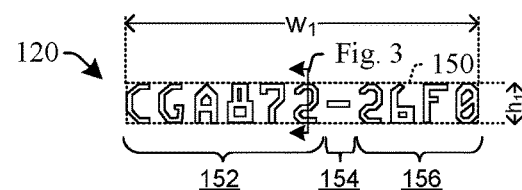
FIG. 4 illustrates a top view of a primary identification mark in accordance with some embodiments.

FIG. 4 illustrates an example of the first identification mark 120 in accordance with some embodiments. The first identification mark 120 is bounded by an outer perimeter 150, which has a first width, w1, in the plane of the first face 102 and has a first height, h1, in the plane of the first face 102. In some embodiments, the first width, w1, ranges between 3 millimeters (mm) and 5 mm, and the first height, h1, ranges between 0.25 mm and 0.75 mm. The first identification mark 120 includes a first plurality of alphanumeric characters. For example, in FIG. 4, the first identification mark 120 takes the form of an alphanumeric string consisting of: a first group of six alphanumeric characters 152, followed by a dash 154, followed by a second group of four alphanumeric characters 156.

Figure 5:
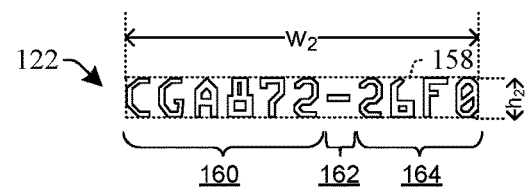
FIG. 5 illustrates a top view of a supplemental identification mark in accordance with some embodiments.

FIG. 5 illustrates an example of the second identification mark 122 in accordance with some embodiments. The second identification mark 122 is bounded by a second outer perimeter 158, which a second width, w2, in the plane of the first face 102 and a second height, h2, in the plane of the first face 102. In some embodiments, the width of the second identification mark, w2, ranges between 3 millimeters (mm) and 5 mm, and the height of the second identification mark, h2, ranges between 0.25 mm and 0.75 mm. The second identification mark includes a second plurality of alphanumeric characters, which in some embodiments can consist of: a first group of six alphanumeric characters 160, followed by a dash 162, followed by a second group of four alphanumeric characters 164. The first plurality of alphanumeric characters often has the same alphanumeric character values as the second plurality of alphanumeric characters, although in other embodiments their alphanumeric character values can be different. Further, the outer perimeter of the first identification mark has a length that is typically equal to that of the outer perimeter of the second identification mark, but in other embodiments the lengths of these perimeters can be different.

It will be appreciated that although the figures illustrate the first outer perimeter 150 and second outer perimeter 158 as lines that surround the first identification mark 120 and second identification mark 122, in typical embodiments these outer perimeters are merely conceptual or virtual geometries that connect the edges of the alphanumeric characters and are not physically imprinted on the surface of the wafer.

Figure 6A:
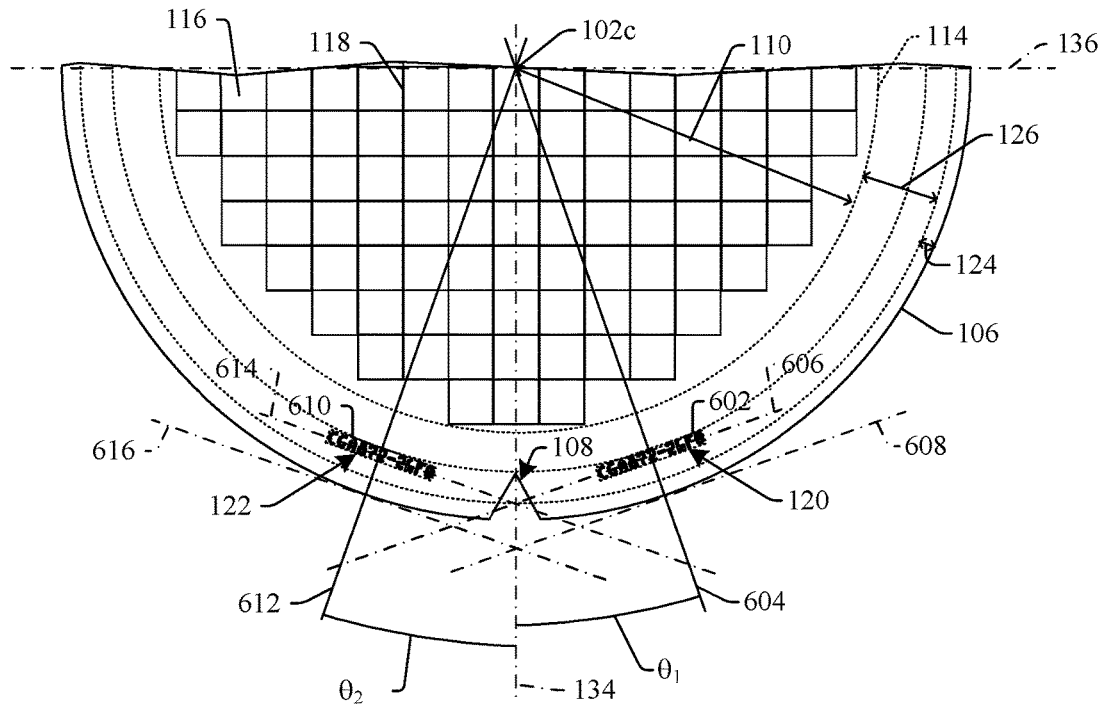
FIG. 6A illustrates a top view of a semiconductor wafer including an identification mark in accordance with some embodiments.

As illustrated in FIG. 6A, in some embodiments the first identification mark 120 includes a first plurality of alphanumeric characters whose outermost edges fall on a first rectangular perimeter 602. A first central point within the first rectangular perimeter 602 lies on a first radial axis 604 passing through the first center 102c and wherein a first line 606, which is parallel to a first tangential segment 608 that intersects the first radial axis 604 at the circumferential edge 106, passes through respective centers of the first plurality of alphanumeric characters and intersects the first central point.

The second identification mark 122 includes a second plurality of alphanumeric characters whose outermost edges fall on a second rectangular perimeter 610. A second central point within the second rectangular perimeter 610 lies on a second radial axis 612 passing through the second center and wherein a second line 614, which is parallel to a second tangential segment 616 that intersects the second radial axis 612 at the circumferential edge 106, passes through respective centers of the second plurality of alphanumeric characters and intersects the second central point. Angles θ1 and θ2 are measured from the y-axis 134 (passing through the center of alignment notch 108) to the first and second radial axes 604, 612, respectively. In some embodiments θ1 and θ2 are equal, but in other embodiments, θ1 and θ2 can be different. In some embodiments, θ1 and/or θ2 ranges between 3 degrees to about 30 degrees, which keeps the first and second identification marks 120, 122 in close proximity to the alignment notch 108.

Figure 6B:
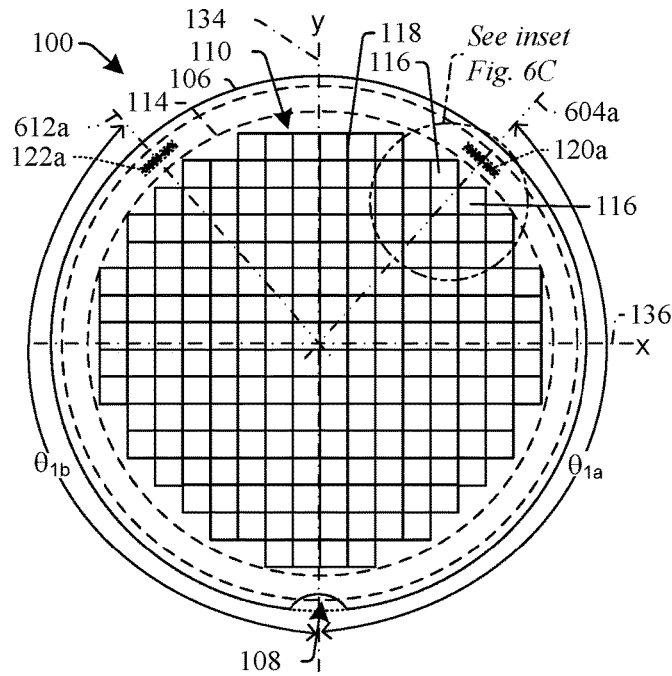
FIG. 6B illustrates a top view of a semiconductor wafer including an identification mark in accordance with other embodiments.

FIG. 6B illustrates another embodiment were the first identification mark 120a and second identification mark 122a are spaced far away from the notch 108. For example, in some embodiments, the center of the first identification mark 120a lies along first radial axis 604a, and is radially offset relative to the notch 108 by angle $\theta_{1a}$, where $\theta_{1a}$ ranges between −90° and −180°, and is approximately −135° in some cases. The center of the second identification mark 122a lies along the second radial axis 612a, is radially offset relative to the notch 108 by angle $\theta_{2a}$, where $\theta_{2a}$ ranges between +90° and +180°, and is approximately +135° in some cases.

Figure 6C:
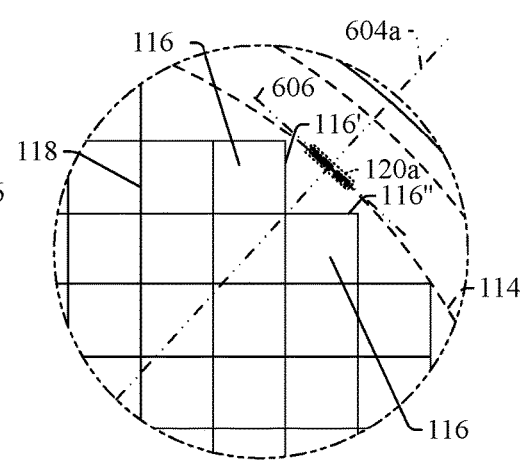
FIG. 6C illustrates an enlarged top view of a portion of the semiconductor wafer of FIG. 6B.

Further, as shown in the enlarged view of FIG. 6C, the center of the first identification mark 120a can be centered relative to a corner (or notch) defined by outermost edges of outermost dies 116 within the central die region 110. Thus, in FIG. 6C, the corner is a right angle defined by edges 116a', and 116", and a first radial axis 604a bisects the right angle. Thus, the first identification mark 120a, whose characters lie on first line 606, is also bisected by the first radial axis, such that the first identification mark 120a extends in equal distances about either side of the first radial axis 604a. It is noted that this configuration, as well as others described herein, can be used for any size wafer.

Figure 7:
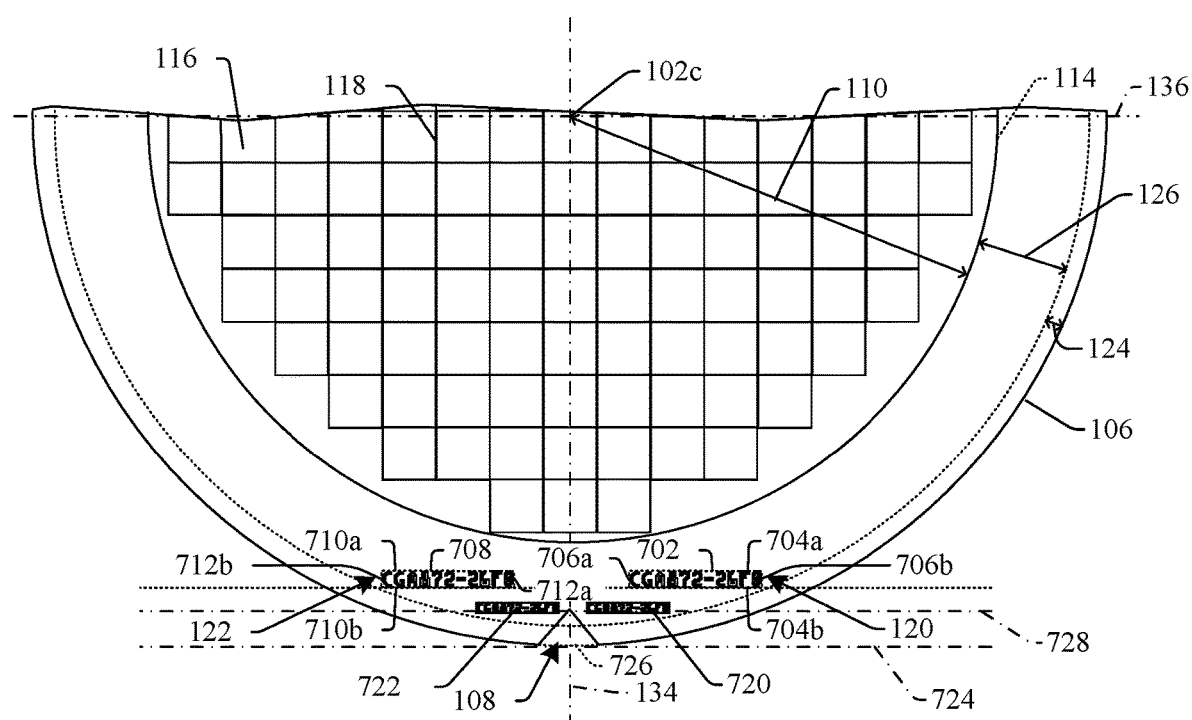
FIG. 7 illustrates a top view of a semiconductor wafer including an identification mark in accordance with some embodiments.

FIG. 7 shows another arrangement for the first and second identification marks 120, 122. As illustrated in FIG. 7, a first axis (e.g., x-axis 136) extends along the first face 102 and passes through the first center 102c, and a second axis (e.g., y-axis 134) extends along the first face 102 and passes through the first center 102c. The second axis is perpendicular to the first axis. The first identification mark 120 has a first rectangular perimeter 702 with a first set of edges (704a, 704b) which run parallel to the first axis 136, and a second set of edges (706a, 706b) that run parallel to the second axis 134, wherein a first edge of the second set of edges is spaced apart from the second axis 134 by a first distance.

The second identification mark 122 has a second rectangular perimeter 708 with a first set of edges (710a, 710b) which run parallel to the first axis 136, and a second set of edges (712a, 712b) that run parallel to the second axis 134, wherein a first edge of the second set of edges is spaced apart from the second axis 134 by a second distance. The second distance is often equal to the first distance, but can also be different from the first distance. In many embodiments consistent with FIG. 7, a row of die within the die region have a bottom edge arranged in parallel with the first sets of edges 704a, 704b, 710a, 710b. In some cases, the first distance is less than a minimum width of the first identification mark 120, as measured between the second set of edges.

Further, in some embodiments, such as shown by alternate locations of the first and second identification marks 720, 722, a tangential segment 724 to the first face 102 is present at a virtual extension 726 of the circumferential edge 106 at the alignment notch 108. A line 728, which is parallel with the tangential segment 724 passes through each of the alignment notch 108, the first identification mark 720, and the second identification mark 722. Similar alternate locations could be applied in FIG. 6A's embodiment, as well as other embodiments disclosed herein.

FIGS. 8A-8B through FIGS. 11A-11B show a sample manufacturing flow, which can be consistent for example with some a 200 mm wafer manufacturing flows, among others.

In FIGS. 8A-8B, the manufacturing flow starts with a semiconductor wafer 100.

In FIGS. 9A-9B, a first identification mark 120 is formed on a front side of the wafer 100. During a typical process of forming the first identification mark 120, a surface of the semiconductor wafer is etched, burned, imprinted, or otherwise patterned with the first identification mark 120. In some embodiments, the first identification mark 120 can be placed directly on an upper surface of the semiconductor wafer 100, while in other embodiments the identification mark can be placed on an upper surface of a dielectric layer (e.g., silicon dioxide layer) directly over the upper surface of the semiconductor wafer. Openings or recesses in the upper surface of the semiconductor wafer and/or dielectric layer thereby correspond to the first identification mark. These openings or recesses can be formed, for example, by a laser beam that is focused and pulsed in a pattern that punctures the surface of the semiconductor wafer and/or dielectric layer to form multiple discrete pits which are collectively in the shape of the first identification mark 120. In other embodiments, a photoresist layer can be spun on and patterned to have an opening corresponding to an outline of the identification mark, and with the photoresist pattern in place, and etch can be carried out to imprint the first identification mark in the upper surface of the semiconductor wafer 100. In still other embodiments, other techniques, such as e-beam writing, or die stamping, among others, can be used to form the first identification mark 120.

Figure 10A:
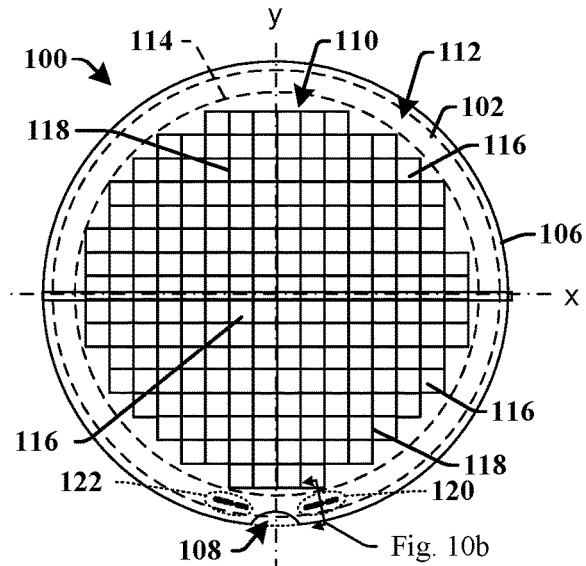
Figure 10B:
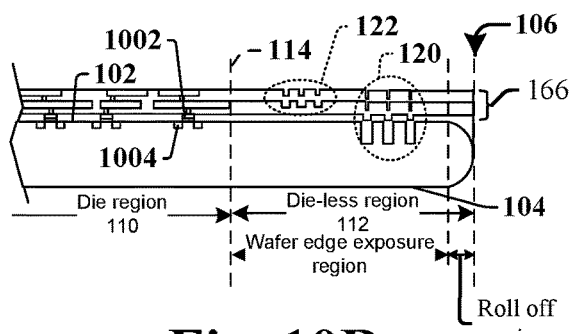

In FIGS. 10A-10B, device features, such as transistor structures including a gate 1002, source/drain regions 1004, and a BEOL metallization structure 166, such as metal layers and conductive vias which extend through interlayer dielectric (ILD) layers, are formed over the semiconductor wafer 100. In some cases, the first identification mark 120 is naturally carried from the surface contours of one layer up to the next layer without having the need to re-form the first identification mark 120 on the upper layers. The first identification mark 120 can be checked at each layer, and if the first identification mark 120 is becoming unidentifiable or is expected to become unidentifiable (due to next layer being too thick or other properties of one or more layers), a supplemental identification mark (e.g., second identification mark 122) can optionally be formed.

Figure 11A:
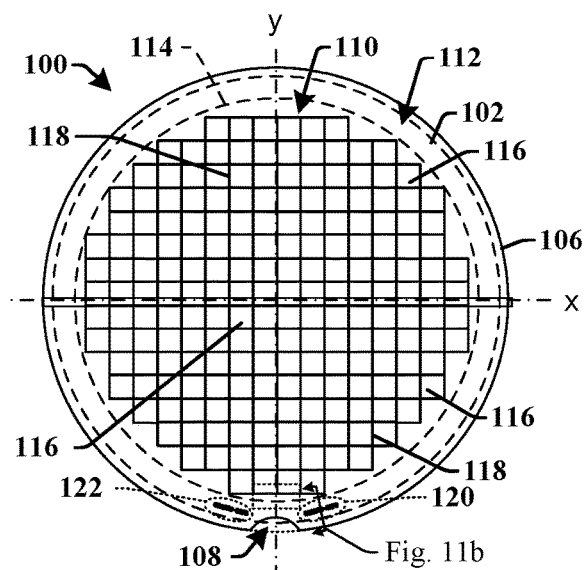
Figure 11B:
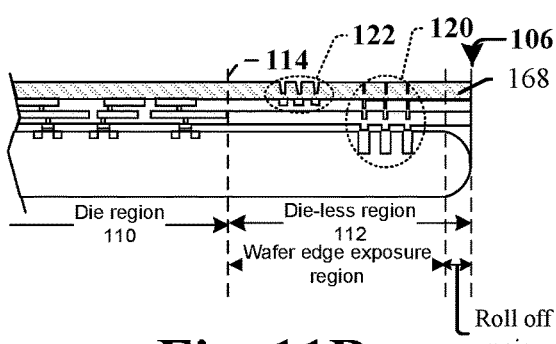

In FIGS. 11A-11B, a passivation layer 168 is formed over the semiconductor wafer 100 with the first identification mark, which may also be referred to as a primary identification mark, and/or the second identification mark 122 (supplemental identification mark) still being visible on the upper surface of the passivation layer 168. The passivation layer 168 can include an epoxy, resin, silicon nitride, and/or ceramic material.

Figure 12:
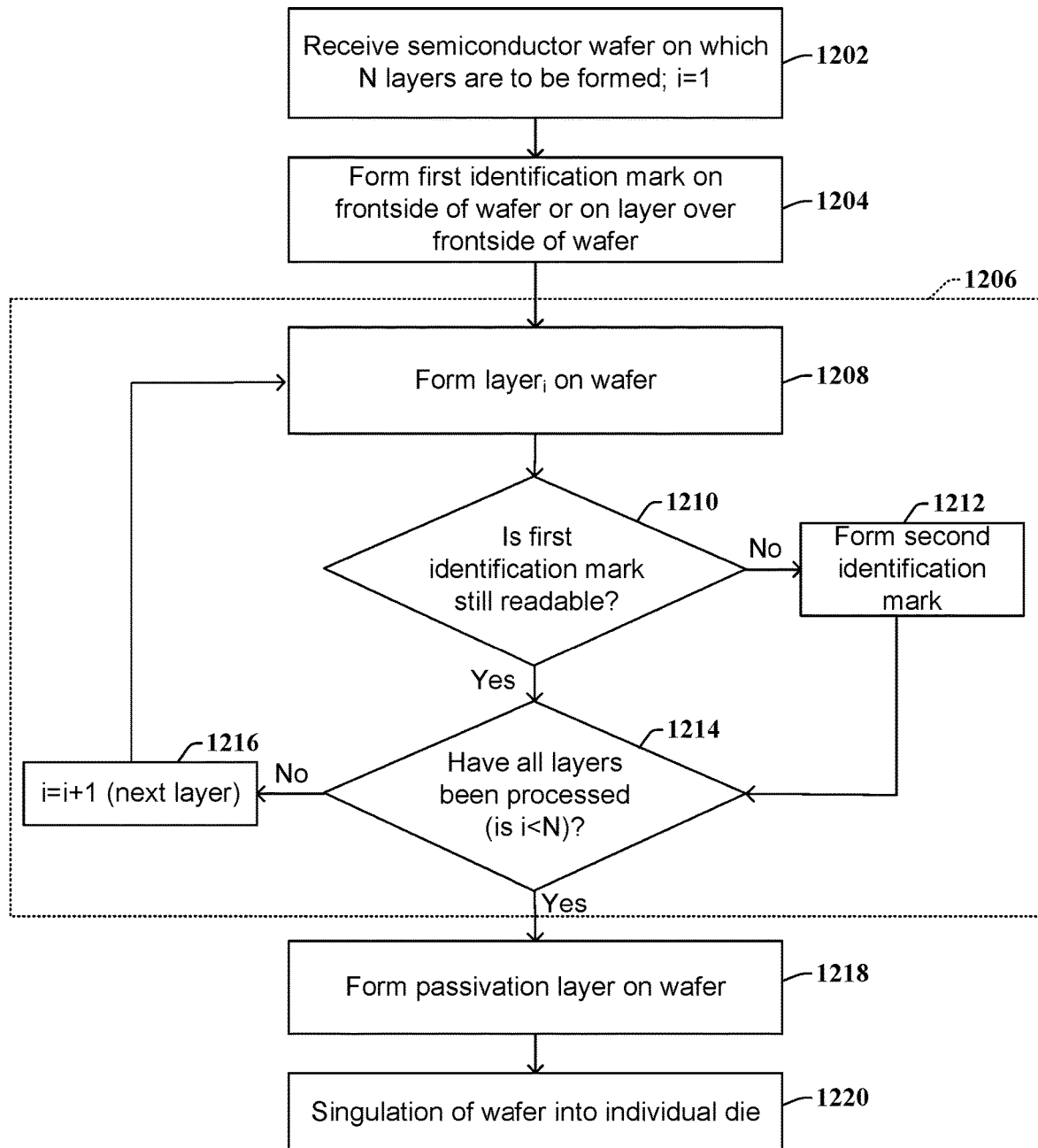
FIG. 12 shows some embodiments of a manufacturing flow, which is consistent with some embodiments of FIGS. 8A-8B through FIGS. 11A-11B, in flow chart format.

FIG. 12 shows a flow chart consistent with some embodiments of the manufacturing flow illustrated in FIGS. 8A-8B through FIGS. 11A-11B.

At 1202, a semiconductor wafer is received. N layers, which typically include at least one dielectric layer and at least one conductive layer as well as at least one semiconductor layer in some embodiments, are to be formed over the semiconductor wafer. In the flow chart of FIG. 12, an index variable (i) is initialized to one (i=1), and will be updated during the manufacturing flow to keep track of the various layers as they are formed. FIGS. 8A-8B show an example of some manners in which 1202 can be implemented.

At 1204, a first identification mark is formed on a frontside of the wafer or on a layer over the frontside of wafer. For example, the first identification mark can be directly imprinted on the frontside of the wafer, or can be imprinted directly on a dielectric layer (e.g., SiO2 layer) which is directly over the frontside of the wafer. The first identification mark can take various forms, but in typical embodiments, the first identification mark 120 takes the form of an alphanumeric string consisting of a predetermined number of letters and/or numbers. For example, in some cases, the first identification mark consists of: a first group of six alphanumeric characters, followed by a dash, followed by a second group of four alphanumeric characters. In some embodiments, the first identification mark is formed by pulsing a laser to form a first plurality of discrete pits, wherein the first plurality of discrete pits collectively establish a first series of alphanumeric characters corresponding to the first identification mark. FIGS. 9A-9B show an example of some manners in which 1204 can be implemented.

At 1206, at least one dielectric layer and/or at least one conductive layer as well as at least one optional semiconductor layer is formed over the semiconductor wafer and over the first identification mark. These layers help to establish one or more semiconductor devices, such as a transistor, and/or a back-end-of-line (BEOL) metallization structure over the frontside of the wafer. FIGS. 10A-10B show an example of some manners in which 1206 can be implemented.

More particularly, within 1206, at 1208 an ith layer (e.g., the first time through 1206 i=1 and the ith layer is a first layer; while for the second time through 1206, i=2 and the ith layer is a second layer; etc.) is formed on the wafer. At 1210, the method determines whether the first identification mark is still readable/discernable from overtop the first layer. The method can make this determination by optical means, for example, taking a digital image from overtop the first layer and determining whether edges of the characters or other marks are sufficiently distinct to discern the values of the characters. In other embodiments, rather than taking an actual image, the method has been programmed to expect that the values of the characters will become undiscernible at some pre-determined layer. For example, the method may determine, based on experimental results for previous fab samples and/or modeling results, that a metal 3 BEOL metal layer or an ILD4 layer, for example, will cause the characters to become undiscernible. If the identification mark is no longer discernible due to formation of the ith layer (i.e., No at 1210), the method proceeds to 1212 and forms second identification mark on the ith layer. On the other hand, if the identification mark is still discernible after formation of the ith layer (i.e., Yes at 1210), the method proceeds to 1214 and a determination is made whether all layers have been processed (is i<N?). If there are still additional layers to be processed (i.e., NO at 1214), i is incremented (i=i+1), and the method returns to 1208 and the next layer is formed on the wafer. Each layer is evaluated to determine whether its formation has caused (and/or whether its impending formation is expected to cause) the identification mark to be undiscernible, and if so the second identification mark can be formed at that point when the determination is made.

If all the layers have been processed (i.e., yes at 1214), the method proceeds to 1218 and a passivation layer is formed overtop the structure. FIGS. 11A-11B show an example of some manners in which 1218 can be implemented.

At 1220, after the passivation layer has been formed, the processed wafer can be sent off for testing, and eventually the wafer is singulated into individual die, which are packaged and sold.

FIGS. 13A-13D through FIGS. 16A-16C show a sample manufacturing flow, such as a 300 mm wafer manufacturing flow. In each of these figures, figure "a" (e.g., FIG. 13a, . . . ) depicts the front side of the wafer, figure "b" (e.g., FIG. 13b, . . . ) depicts the back side of the wafer, and figure "c" (e.g., FIG. 13c, . . . ) depicts a cross-sectional portion of the wafer.

In FIGS. 13A-13D, method starts with a semiconductor wafer 100. In some cases, the wafer, when received from a wafer manufacturer, already includes a two-dimensional matrix code symbol 1302 on the backside of the wafer, as well as a separate substrate identifier code 1304 on the back side of the wafer. The two-dimensional matrix code symbol 1302, which can for example consist of an array of dot locations thirty-two dots wide and eight dots high, can be added by the wafer manufacturer (e.g., prior to distribution to a semiconductor fabrication facility). The two-dimensional matrix code symbol 1302 generally does not take the form of alphanumeric characters, but can specify such information as whether the substrate is P-type or N-type, the resistivity of the substrate, an ingot ID from which the individual wafer was generated, a unique individual identification mark within the ingot, and the wafer manufacturer's name, among other information. The two-dimensional matrix code symbol 1302 can be formed by a laser, etching process, e-beam writing, ink printing, die stamping, or adhesion of a pre-fabricated identification mark on a paper or plastic label, among others. The substrate identifier code 1304 can consist of twelve alphanumeric characters, each of which consists of an array of dot locations nine dots high and five dots wide. In some embodiments, the substrate identifier code 1304 can contain the same message as the two-dimensional matrix code symbol 1302, with the substrate identifier code 1304 being in font format and two-dimensional matrix code symbol 1302 being in 2D matrix code format. The substrate identifier code 1304 code can be formed by a laser, etching process, e-beam writing, ink printing, die stamping, or adhesion of a pre-fabricated identification mark on a paper or plastic label, among others; and can be formed by the same technique or a different technique than the two-dimensional matrix code symbol 1302.

Figure 14A:
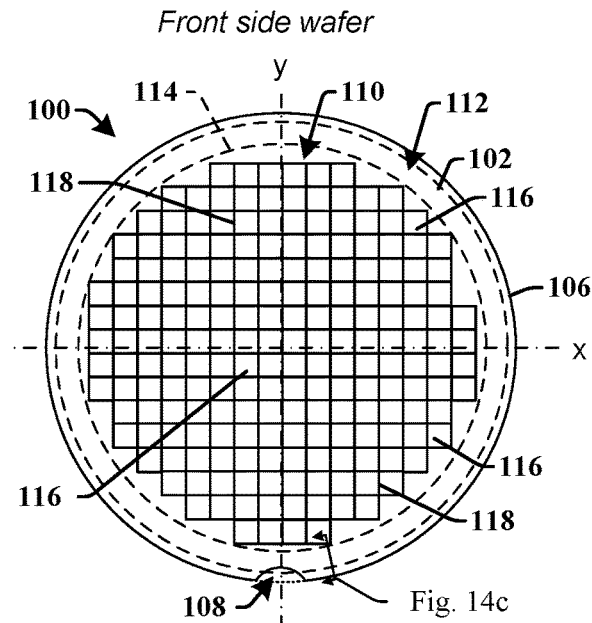
Figure 14B:
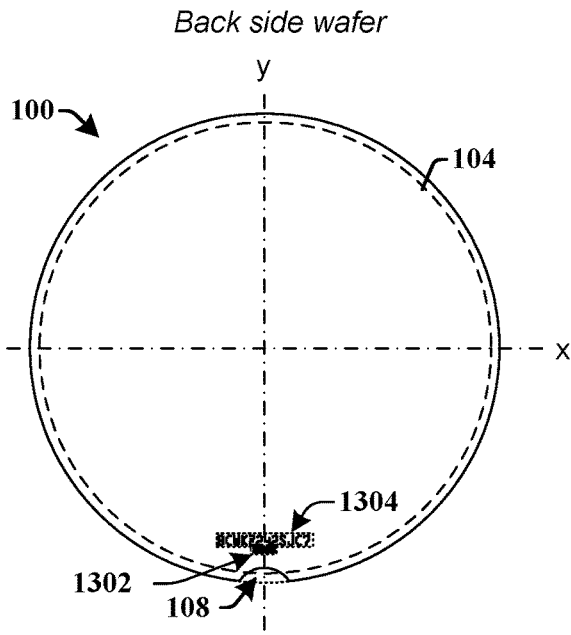
Figure 14C:
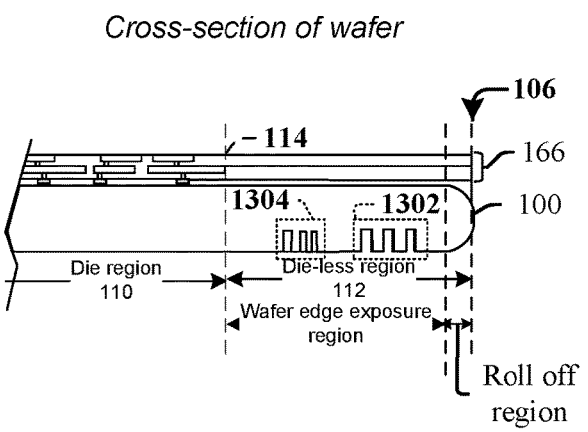

In FIGS. 14A-14C, device features and BEOL metallization structure 166 are formed over the front side of the wafer, with the two-dimensional matrix code symbol 1302 and substrate identifier code 1304 still being viewable on the backside of the wafer. As each layer is formed to establish the device features and BEOL metallization structure 166, the substrate identifier 1304 is read by processing tools from the backside of the wafer.

Figure 15A:
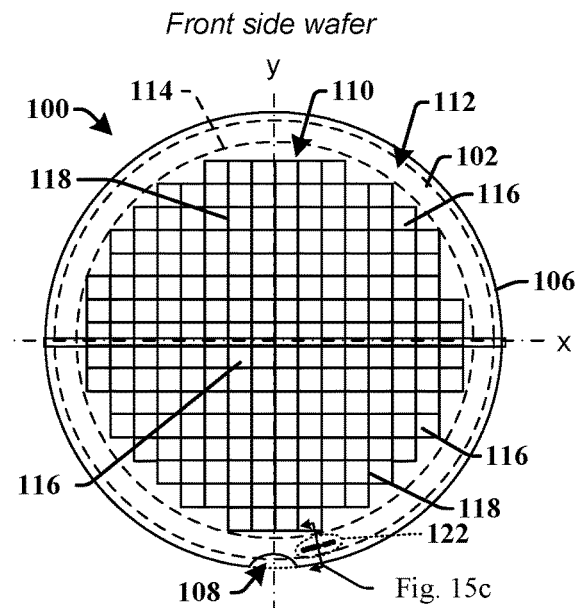
Figure 15B:
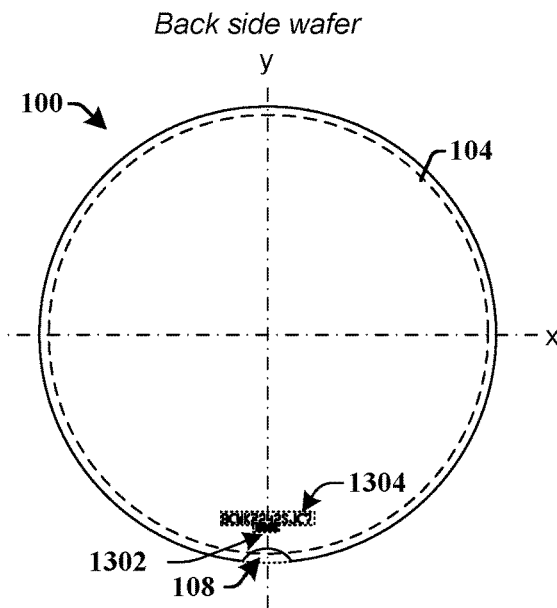
Figure 15C:
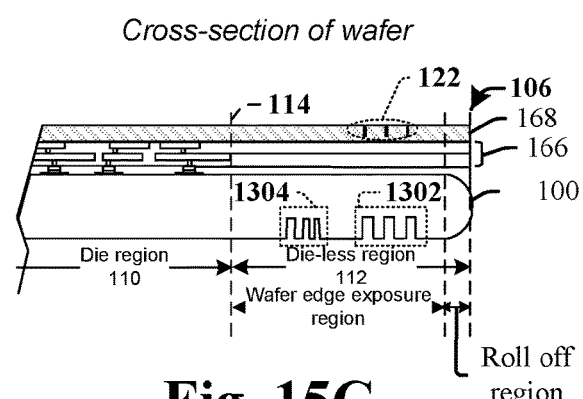

In FIGS. 15A-15C, a passivation layer 168 is formed over the wafer while the two-dimensional matrix code symbol 1302 and substrate identifier 1304 are still visible on the backside of the wafer. A supplemental identification mark 122, which is viewable from the frontside of the wafer, is formed in upper surface of passivation layer 168. The supplemental identification mark 122 can include a series of alphanumeric characters, for example as previously illustrated in FIGS. 4-5, and the values of the alphanumeric characters for the supplemental identification mark 122 typically differ from the alphanumeric characters of the substrate identifier 1304. However, the supplemental identification mark 122 is typically linked to the substrate identifier 1304 in a computer database retained by the manufacturer, so these identifiers are related to one another.

In FIGS. 16A-16C, the wafer is sent out to another facility for outsourced assembly and test (OSAT). In OSAT, grinding is performed on the backside of wafer to reduce the thickness of the wafer and remove the two-dimensional matrix code symbol 1302 and substrate identifier 1304. Supplemental identification mark 122 remains in place for OSAT. The OSAT facility uses the supplemental identification mark 122, which is viewable from the passivation layer, for performing tests and/or packaging of the dies.

Figure 17:
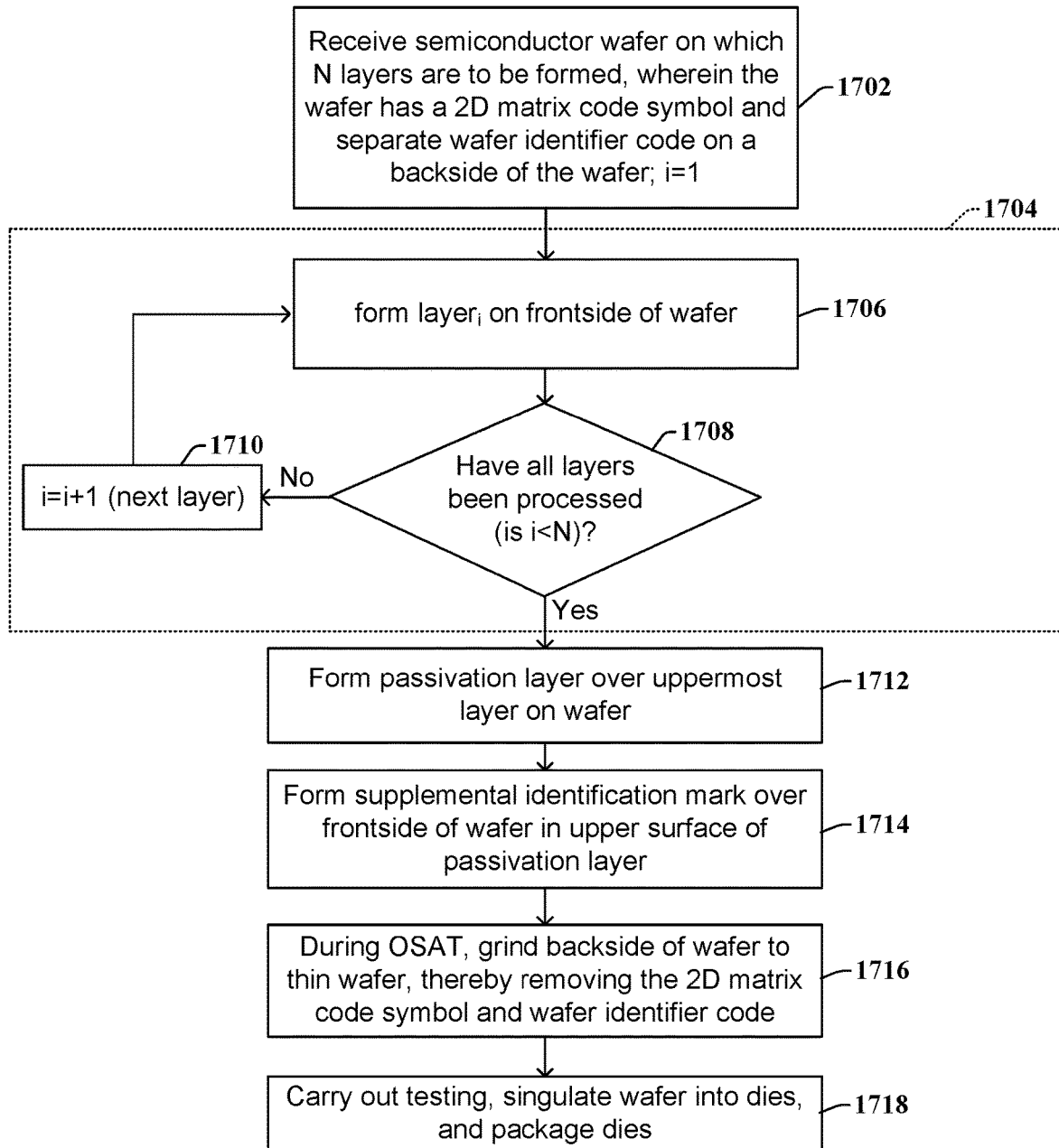
FIG. 17 shows some embodiments of a manufacturing flow, which is consistent with some embodiments of FIGS. 13A-13D through FIGS. 16A-16C, in flow chart format.

FIG. 17 shows a flow chart consistent with some embodiments of the manufacturing flow illustrated in FIGS. 13A-13B through FIGS. 16A-16B.

At 1702, a semiconductor wafer, on which N layers are to be formed, is received. The wafer has a 2D matrix code symbol and separate backside identification mark on a backside of the wafer. In the flow chart of FIG. 17, an index variable (i) is initialized to one (i=1), and will be updated during the manufacturing flow to keep track of the various layers as they are formed. FIGS. 13A-13D show an example of some manners in which 1702 can be implemented.

At 1704, successive layers of semiconductor, conductive material (e.g., metal or doped polysilicon), and/or dielectric are formed over the semiconductor wafer to fashion devices on the semiconductor wafer. FIGS. 14A-14C show an example of some manners in which 1704 can be implemented. For each layer, the process forms an ith layer (1706), evaluates whether all layers have been formed (1708), and either moves onto form another layer by incrementing I (1710) or, when all layers have been processed, forms a passivation layer overtop the structure (1712). FIGS. 15A-15C show an example of some manners in which 1712 can be implemented.

After the passivation layer has been formed, the method proceeds to 1714 where a supplemental identification mark is formed in upper surface of the passivation layer over a frontside of the wafer. FIGS. 15A-15C show an example of some manners in which 1714 can be implemented.

At 1716, the processed wafer can be sent off for outsourced assembly and testing (OSAT), where the supplemental identification mark will be utilized for tracking the wafers during testing. During OSAT, a grinding operation is performed on the backside of wafer to thin the wafer, thereby removing the 2D matrix code symbol and backside identification mark. FIGS. 16A-16C show an example of some manners in which 1712 can be implemented.

At 1718, testing is carried out. After testing, the wafer is singulated into die, which are packaged and sold.

While the disclosed methods may be described and/or illustrated herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases. Further still, although methods are described in relation to FIGS. 8-11 and 13-16, it will be appreciated that the methods are not limited to such structures, but instead may stand alone as a method independent of the structures.

Thus, some embodiments relate to a semiconductor wafer. The wafer includes a first face having a first center, and a second face having a second center. The first center and the second center are each arranged on a central axis of the semiconductor wafer passing through the first face and the second face. The first face and the second face adjoin one another at a circumferential edge. An alignment notch, which extends inwardly from the circumferential edge by an alignment notch radial distance, is disposed at a location along the circumferential edge. The alignment notch radial distance is less than a wafer radius as measured from the first center to the circumferential edge. A die region, which includes an array of die arranged in rows and columns on the first face, is circumferentially bounded by a die-less region which is devoid of die. A first identification mark including a string of characters is disposed entirely in the die-less region to a first side of the alignment notch.

Some other embodiments relate to a semiconductor wafer having a circumferential edge. The wafer includes a die region which includes an array of die arranged in rows and columns and which is circumferentially bounded by a die-less region which is devoid of die. A generally circular die region edge separates the die region from the die less region. An alignment notch is disposed at a location along the circumferential edge of the semiconductor wafer. The alignment notch extends inwardly from the circumferential edge by an alignment notch radial distance. A first identification mark is disposed entirely in the die-less region to a first side of the alignment notch. A second identification mark is disposed entirely in the die-less region to a second side of the alignment notch.

Still other embodiments relate to a semiconductor wafer which includes a first face having a first center and a second face having a second center. The first center and the second center are each arranged on a central axis of the semiconductor wafer which passes through the first face and the second face. The first face and the second face adjoin one another at a circumferential edge. An alignment notch is disposed at a location along the circumferential edge. The alignment notch extends inwardly from the circumferential edge by an alignment notch radial distance. The alignment notch radial distance is less than a wafer radius as measured from the first center to the circumferential edge. A die region includes an array of die arranged in rows and columns on the first face and is circumferentially bounded by a die-less region which is devoid of die. A primary identification mark is disposed directly on the first face entirely in the die-less region to a first side of the alignment notch. A supplemental identification mark is disposed in a layer over the first face. The supplemental identification mark has the same value as the primary identification mark but is disposed at a height over the first face that is higher than that of the primary identification mark.

Some other embodiments relate to a method in which a semiconductor wafer is received. A first identification mark is formed on a frontside of the wafer or on a layer over the frontside of wafer. At least one dielectric layer and at least one conductive layer are formed over the semiconductor wafer and over the first identification mark. After the at least one dielectric layer and the at least one conductive layer have been formed, the method determines whether the first identification mark is readable. A second identification mark is selectively formed in or over the at least one dielectric layer and the at least one conductive layer, based on whether the first identification mark is readable.

Still other embodiments relate to a method in which semiconductor wafer on which N layers are to be formed is received. The wafer has a two-dimensional matrix code symbol on a backside of the wafer and an identification mark, which is spaced apart from the matrix code symbol, on the backside of the wafer. At least one dielectric layer and at least one conductive layer is formed over the semiconductor wafer to establish a semiconductor device over a frontside of the semiconductor wafer. A passivation layer is formed over the at least one dielectric layer and the at least one conductive layer. After the passivation layer has been formed, a supplemental identification mark is formed over the frontside of the wafer in an upper surface of the passivation layer.

Still other embodiments relate to a method. In this method, a semiconductor wafer, which includes a frontside face having a first center and a backside face having a second center, is received. The frontside face includes a die region comprising an array of die arranged in rows and columns and being circumferentially bounded by a die-less region which is devoid of die. The first center and the second center are each arranged on a central axis of the semiconductor wafer passing through the frontside face and the backside face. The frontside face and the backside face adjoin one another at a circumferential edge. The backside face is devoid of semiconductor devices but includes a backside identification mark. An alignment notch is disposed at a location along the circumferential edge. The alignment notch extends inwardly from the circumferential edge by an alignment notch radial distance. A first frontside identification mark is formed on the frontside face of the semiconductor wafer, and a layer is formed over the frontside face and over the first frontside identification mark. After the layer has been formed, the method determines whether the first frontside identification mark is readable. A second frontside identification mark is selectively formed in or over the layer based on whether the first identification mark is readable.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor wafer, comprising:
a first face having a first center;
a second face having a second center, the first center and the second center each being arranged on a central axis of the semiconductor wafer passing through the first face and the second face, and the first face and the second face adjoining one another at a circumferential edge;
an alignment notch disposed at a location along the circumferential edge, the alignment notch extending inwardly from the circumferential edge by an alignment notch radial distance, the alignment notch radial distance being less than a wafer radius as measured from the first center to the circumferential edge;
a die region comprising an array of die arranged in rows and columns on the first face and being circumferentially bounded by a die-less region which is devoid of die; and
a first identification mark comprising a string of different alphanumeric characters disposed entirely in the die-less region to a first side of the alignment notch;
wherein the die region has an outermost edge spaced apart from an innermost tip of the alignment notch such that the outermost edge of the die region is radially spaced apart from the circumferential edge by an amount ranging from two times the alignment notch radial distance to ten times the alignment notch radial distance.

2. The semiconductor wafer of claim 1, wherein the first identification mark is bounded by an outer perimeter, the outer perimeter having a width in a plane of the first face ranging between 3 millimeters (mm) and 5 mm and having a height in the plane of the first face ranging between 0.25 mm and 0.75 mm.

3. The semiconductor wafer of claim 1:
wherein the first identification mark includes a first plurality of alphanumeric characters whose outermost edges fall on a first rectangular perimeter, where a first central point within the first rectangular perimeter lies on a first radial axis passing through the first center and wherein a first line, which is parallel to a first tangential segment that intersects the first radial axis at the circumferential edge, passes through respective centers of the first plurality of alphanumeric characters and intersects the first central point.

4. The semiconductor wafer of claim 3, further comprising:
a second identification mark disposed entirely in the die-less region to a second side of the alignment notch; and
wherein the second identification mark includes a second plurality of alphanumeric characters whose outermost edges fall on a second rectangular perimeter, where a second central point within the second rectangular perimeter lies on a second radial axis passing through the second center and wherein a second line, which is parallel to a second tangential segment that intersects the second radial axis at the circumferential edge, passes through respective centers of the second plurality of alphanumeric characters and intersects the second central point.

5. The semiconductor wafer of claim 1, further comprising:
a second identification mark disposed entirely in the die-less region to a second side of the alignment notch; and
wherein the first identification mark includes a first plurality of alphanumeric characters and the second identification mark includes a second plurality of alphanumeric characters, the first plurality of alphanumeric characters having the same alphanumeric character values as the second plurality of alphanumeric characters.

6. The semiconductor wafer of claim 5:
wherein the first identification mark comprises a first series of grooves extending into the first face of the semiconductor wafer or into a first layer over the first face of the semiconductor wafer; and
wherein the second identification mark comprises a second series of grooves extending into a second layer over the first face of the semiconductor wafer or over the first layer.

7. The semiconductor wafer of claim 1, wherein the first identification mark is an alphanumeric string consisting of: a first group of six alphanumeric characters, followed by a dash, followed by a second group of four alphanumeric characters.

8. The semiconductor wafer of claim 1, further comprising:
a second identification mark disposed entirely in the die-less region to a second side of the alignment notch; and wherein a tangential segment to the first face is present at a virtual extension of the circumferential edge at the alignment notch, and wherein a line, which is parallel with the tangential segment passes through each of the alignment notch, the first identification mark, and the second identification mark.

9. The semiconductor wafer of claim 1, wherein the first identification mark comprises a series of grooves extending into the first face of the semiconductor wafer or into a layer over the first face of the semiconductor wafer.

10. A semiconductor wafer having a circumferential edge, comprising:
   a die region comprising an array of die arranged in rows and columns and being circumferentially bounded by a die-less region which is devoid of die, wherein a generally circular die region edge separates the die region from the die-less region;
   an alignment notch disposed at a location along the circumferential edge of the semiconductor wafer, the alignment notch extending inwardly from the circumferential edge by an alignment notch radial distance;
   a first identification mark disposed entirely in the die-less region to a first side of the alignment notch; and
   a second identification mark disposed entirely in the die-less region to a second side of the alignment notch;
   wherein the first identification mark comprises a first series of grooves extending into a first face of the semiconductor wafer or into a first layer over the first face of the semiconductor wafer; and
   wherein the second identification mark comprises a second series of grooves extending into a second layer over the first face of the semiconductor wafer or over the first layer.

11. The semiconductor wafer of claim 10:
   wherein the first identification mark includes a first plurality of alphanumeric characters whose outermost edges fall on a first rectangular perimeter on the first face of the semiconductor wafer, where a first central point within the first rectangular perimeter lies on a first radial axis passing through a center of the first face.

12. The semiconductor wafer of claim 11, further comprising:
   wherein the second identification mark includes a second plurality of alphanumeric characters whose outermost edges fall on a second rectangular perimeter, where a second central point within the second rectangular perimeter lies on a second radial axis passing through the center of the first face.

13. The semiconductor wafer of claim 10, further comprising:
   wherein the first identification mark includes a first plurality of alphanumeric characters and the second identification mark includes a second plurality of alphanumeric characters, the first plurality of alphanumeric characters having the same alphanumeric character values as the second plurality of alphanumeric characters.

14. The semiconductor wafer of claim 10:
   wherein the first identification mark is bounded by a first outer perimeter, the first outer perimeter having a width ranging between 3 millimeters (mm) and 5 mm and having a height ranging between 0.25 mm and 0.75 mm.

15. The semiconductor wafer of claim 14:
   wherein the second identification mark is bounded by a second outer perimeter that is substantially the same size as the first outer perimeter, the second outer perimeter having a width ranging between 3 millimeters (mm) and 5 mm and having a height ranging between 0.25 mm and 0.75 mm.

16. The semiconductor wafer of claim 10:
   wherein the generally circular die region edge is spaced apart from an innermost tip of the alignment notch such that the generally circular die region edge is radially spaced apart from the circumferential edge by an amount ranging from two times the alignment notch radial distance to ten times the alignment notch radial distance.

17. A semiconductor wafer having a circumferential edge, comprising:
   a die region comprising an array of die arranged in rows and columns and being circumferentially bounded by a die-less region which is devoid of die, wherein a generally circular die region edge separates the die region from the die-less region; and
   an alignment notch disposed at a location along the circumferential edge of the semiconductor wafer, the alignment notch extending inwardly from the circumferential edge by an alignment notch radial distance;
   a first identification mark disposed entirely in the die-less region to a first side of the alignment notch by a first distance; and
   a second identification mark disposed entirely in the die-less region to a second side of the alignment notch by a second distance, the second distance being equal to the first distance;
   wherein the first identification mark is bounded by a first outer perimeter, the first outer perimeter having a width ranging between 3 millimeters (mm) and 5 mm and having a height ranging between 0.25 mm and 0.75 mm;
   wherein the second identification mark is bounded by a second outer perimeter that is substantially the same size as the first outer perimeter, the second outer perimeter having a width ranging between 3 millimeters (mm) and 5 mm and having a height ranging between 0.25 mm and 0.75 mm.

18. The semiconductor wafer of claim 17, wherein the first identification mark comprises a series of grooves extending into a first face of the semiconductor wafer or into a layer over the first face of the semiconductor wafer.

19. The semiconductor wafer of claim 17:
   wherein the first identification mark comprises a first series of grooves extending into a first face of the semiconductor wafer or into a first layer over the first face of the semiconductor wafer; and
   wherein the second identification mark comprises a second series of grooves extending into a second layer over the first face of the semiconductor wafer or over the first layer.

20. The semiconductor wafer of claim 17:
   wherein the generally circular die region edge is spaced apart from an innermost tip of the alignment notch such that the generally circular die region edge is radially spaced apart from the circumferential edge by an amount ranging from two times the alignment notch radial distance to ten times the alignment notch radial distance.

* * * * *